United States Patent [19]

Mace et al.

[11] Patent Number: 5,454,058
[45] Date of Patent: Sep. 26, 1995

[54] SELECTIVE OPTICAL SIGNAL SWITCH AND/OR COMBINER

[75] Inventors: David Mace; Michael J. Adams; Michael A. Fisher; Jaspal Singh; Ian D. Henning, all of Suffolk, England

[73] Assignee: BT&D Technologies, Ltd., Suffolk, England

[21] Appl. No.: 949,887

[22] PCT Filed: Mar. 28, 1991

[86] PCT No.: PCT/GB91/00502

§ 371 Date: Nov. 24, 1992

§ 102(e) Date: Nov. 24, 1992

[87] PCT Pub. No.: WO91/15796

PCT Pub. Date: Oct. 17, 1991

[30] Foreign Application Priority Data

Mar. 30, 1990 [GB] United Kingdom ............... 9007139

[51] Int. Cl.$^6$ ............................. G02B 6/14; G02B 6/28
[52] U.S. Cl. ............................. 385/122; 385/16; 372/6
[58] Field of Search ............................. 385/16, 17, 45, 385/49, 50, 52, 88, 129, 130, 24, 39, 122; 372/6, 50, 46

[56] References Cited

U.S. PATENT DOCUMENTS

| | | | |
|---|---|---|---|
| 4,618,210 | 10/1986 | Kondo | 385/17 |
| 4,693,547 | 9/1987 | Soref et al. | 385/17 X |
| 4,787,692 | 11/1988 | Spanke | 385/17 |
| 4,877,299 | 10/1989 | Lorenzo et al. | 385/17 X |
| 5,009,477 | 4/1991 | Alferness et al. | 385/17 |
| 5,285,465 | 2/1994 | Schilling et al. | 385/45 X |
| 5,305,412 | 4/1994 | Paoli | 385/122 |

FOREIGN PATENT DOCUMENTS 0241143 10/1987 European Pat. Off. .
0332446 9/1989 European Pat. Off. .
WO91/03760 9/1990 WIPO .

OTHER PUBLICATIONS

Kobayashi et al, "Guided-Wave Optical Gate Matrix Switch", ECOC 1985, Post-deadline Digest, pp. 73–76 No Month.
Ikeda et al, "Monolithic LD Optical Matrix Switches", ECOC 1987, vol. 1, pp. 227–230.
Kishimoto et al, "Optical Self-Routing Switch Using Integrated Laser Diode Optical Switch", IEEE Journal on Selected Areas in Communications, vol. 6, No. 7, Aug. 1988, pp. 1248–1254.
Otsuka, "Proposals and Analyses on Laser Amplifier Based Integrated Optical Circuits", IEEE Journal of Quantum Electronics, vol. EQ–17, No. 1, pp. 23–28.
Sakano et al, "InGaAsP/InP Monolithic Integrated Circuit with Lasers and an Optical Switch", Electronics Letters, May 22, 1986, vol. 22, No. 11, pp. 594–596
F. Hernandex-Gil et al, "Tunable MQW-DBR Laser with Monolithically Integrated GaInAsP/InP Directional Coupler Switch", Electronics Letters, Sep. 14, 1989, vol. 25, No. 19, pp. 1271–1272.
Muller et al, "Low Current Plasma Effect Optical Switch on InP", Electronic Letters, Jan. 18, 1990, vol. 26, No. 2, pp. 115–116.

Primary Examiner—Akm E. Ullah
Attorney, Agent, or Firm—Nixon & Vanderhye

[57] ABSTRACT

An optical component fabricated from a semi-conductor wafer in which the epilayers are in the InCaAsP system comprises a pair of ridge waveguides. The ridge waveguides are proximate and parallel to each other in a first region, and diverge from each other in a second region. Each waveguide has a continuous electric contact over its upper surface to provide a first light amplification zone through or beneath at least a portion of both first and second light guiding paths and a second light amplification zone through or beneath at least a portion of both the first and a third light guiding path. The component can be used as a low loss 1×2 switch, or as a low loss 2×1 combiner.

32 Claims, 4 Drawing Sheets

LEC LAUNCHED INTO RIDGE 2

LEC LAUNCHED INTO RIDGE 1

5,454,058

SELECTIVE OPTICAL SIGNAL SWITCH AND/OR COMBINER

BACKGROUND OF THE INVENTION

1. Field of the Invention

The present invention relates to optical components and in particular a twin guide amplifier which can be used as either a 1×2 optical switch, or a 2×1 optical combiner with low or zero loss.

2. Related Art

Optical components of this type can be used as elements in optical telecommunications systems. A 1×2 optical switch is capable of directing an optical input from one port to a selected one of two output ports. A 2×1 optical combiner is capable of combining optical inputs from two ports to provide a single optical output from the remaining port.

Electromagnetic radiation used in optical communications normally lies either in the near infra-red or visible region of the spectrum. The terms optical and light should not, therefore, be interpreted in this specification as implying a limitation to the visible region of the electromagnetic spectrum.

The energy of semi-conductor bandgaps in this specification are expressed in terms of the wavelength of electromagnetic radiation having a quantum energy equal to the bandgap energy, i.e. capable of raising a current carrier over the bandgap.

Optical components of the type with which this invention is concerned are formed on semi-conductor substrates by techniques similar to those used for production of integrated electronic components. Such components are frequently referred to as integrated optical components. Many different forms of integrated optical components are known, for example as described in European Patent Application 0241143, European Patent Application 89302355.6 and UK Patent Application 8920435.8. In general the techniques for fabricating integrated optical components described in these documents are applicable to the present invention.

Other known devices include integrated laser amplifiers and passive waveguide splitters, as described in "Proposals and Analyses on Laser Amplifier Based Integrated Optical Circuits" K Otsuka, 1981 IEEE Jnl of Quantum Electronics, Vol EQ-17, No.1, Pages 23–28 in which an integrated optical component includes an amplifier and splitter which are separated.

"Guided-wave Optical Gate Matrix Switch", M Kobayashi, ECOC 1985, Post-deadline Digest, pages 73–76 describes a 4×4 matrix switch in which a laser amplifier is inserted for gating and amplification. In this component the splitter and gain blocks are separate and the device has an overall loss of 22 dB and crosstalk less than −13 dB. The individual gates and combiner has a 12 dB loss and less than −18 dB crosstalk.

"InGaAsP/InP Monolithic Integrated Circuit with Lasers and an Optical Switch"—S Sakano, H Innoe, H Nakamura, et al, 1986, Electronic Letters, Vol 22, No.11, pages 594–596 describes a 2×2 carrier injection optical switch with no gain with a laser at each of the two input ports and a laser amplifier at each output port of the switch. Again the switch and amplifier are separate, carrier injection is used to alter the refractive index but does not provide gain. This device achieves crosstalk of less than 13 dB.

Other devices are described in the following papers:

"Monolithic LD Optical Matrix Switches", M Ikeda, O Ohguchi, K Yoshino, ECOC 1987, Vol 1, Page 227–230.

"Optical Amplification by Monolithically Integrated Distributed-Feedback Lasers", H Inoue and S Tsuji, 1987, Applied Physics Letters, Vol 51, No.20, Pages 1577–1579.

"Optical Self-Routing Switch using Integrated Laser Diode Optical Switch", R Kishimoto and M Ikeda, 1988, IEEE Jnl on Sel. Areas in Communication, Vol 6, No.7, Pages 1248–1254.

"Tunable MQW-DBR Laser with Monolithically Integrated GaInAsP/InP Directional Coupler Switch", F Hernandez-Gil, et al, 1989, Electronic Letters, Vol 25, No.19, Pages 1271–1272.

"Widely Tunable Y-coupled cavity integrated Interferometric Injection Laser", Schilling et al, Electronic Letters 26 1990 (4) 243.

G. Muller et al. Electronic Letters 26 1990 (2) 115.

A successful optical switch must have low crosstalk and low or zero loss. The prior art referred to above has, as a common feature, separation of the amplification or active sections of the component from the coupling sections and is characterised by mediocre crosstalk performance.

SUMMARY OF THE INVENTION

According to the present invention there is provided an optical component comprising a first light guiding path optically connected to second and third light guiding paths characterised in that them is provided a first zone capable of light amplification extending continuously through or beneath at least a portion of both first and second light guiding paths and a second zone capable of light amplification extending continuously through or beneath at least a portion of both first and third light guiding paths.

Preferably said optical component includes a plurality of semi-conductor epilayers formed on a semi-conductor substrate capable of lasing action, in which the first, second and third light guiding paths are ridge waveguides.

Said first light guiding path may comprise a pair of proximate ridge waveguides arranged so that in use the evanescent field from each waveguide interacts with the other ridge waveguide.

Said second and third light guiding paths may constitute continuations of said pair of ridge waveguides respectively, arranged to diverge from each other.

Preferably said optical component includes first and second conducting layers each isolated from the other, said first conducting layer extending continuously over one of said pair of ridge waveguides in both a region where said ridge waveguides are proximate and a region in which said ridge waveguides are divergent, said second conducting layer extending continuously over the other of said pair of ridge waveguides in both a region where said ridge waveguides are proximate and a region in which said ridge waveguides are divergent arranged so that in use an electric current passed through the optical component via said first conducting layer activates said first zone capable of light amplification and an electric current passed through the optical component via said second conducting layer activates said second zone capable of light amplification.

We have discovered that by providing amplification associated with either the first and second light guiding paths or the first and third light guiding paths, an enhanced crosstalk characteristic, less than −30 dB is obtained. This, we believe, is because optical absorption in the light guiding path which lacks amplification is high, whereas in the other light guiding path there is optical gain.

BRIEF DESCRIPTION OF THE DRAWINGS

The invention is now described by way of example with reference to the accompanying drawings in which.

DETAILED DESCRIPTION OF EXEMPLARY EMBODIMENTS

Figure 1:
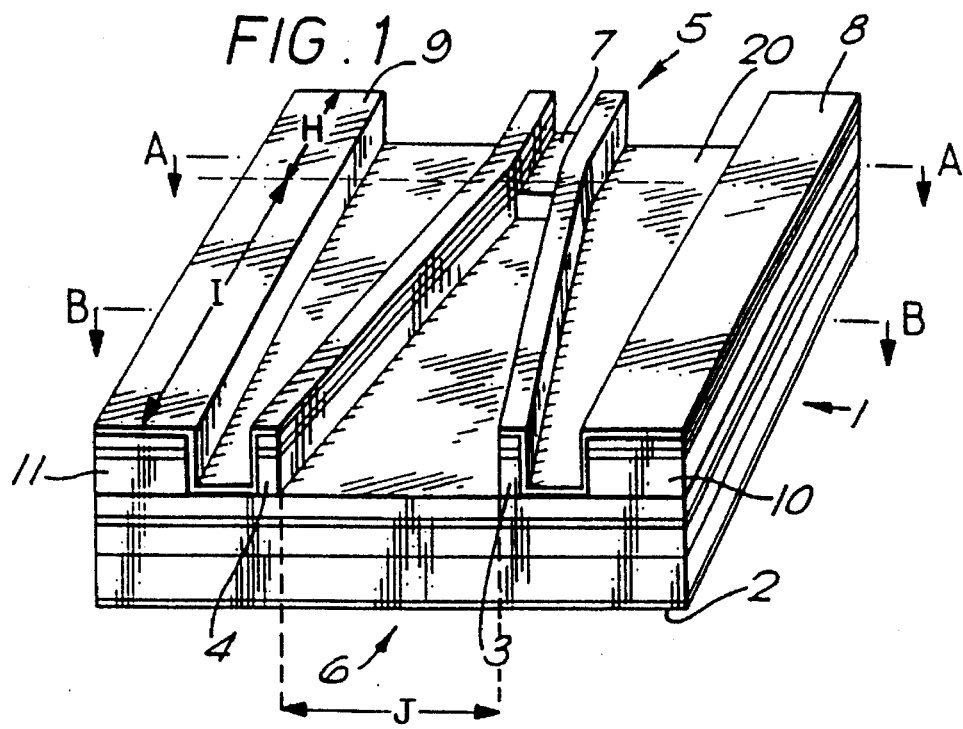
FIG. 1 is an optical component according to the invention.
Figure 2:
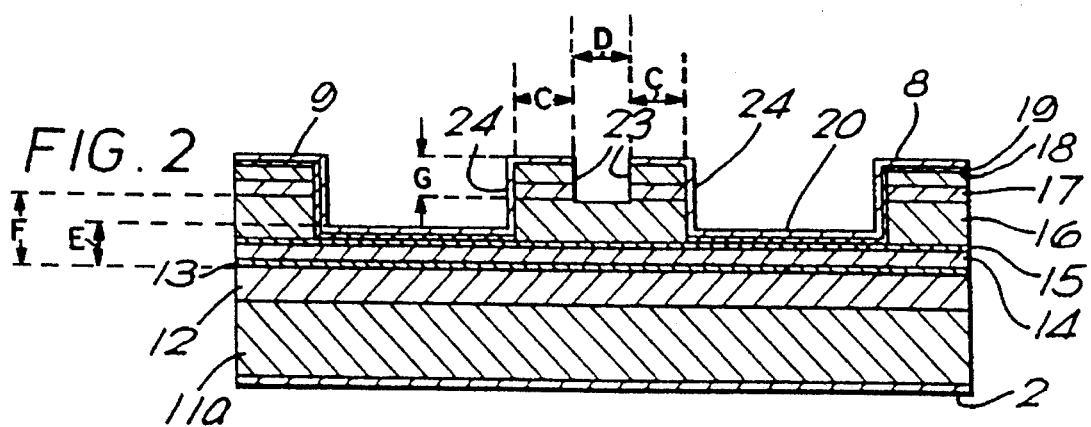
FIG. 2 is a vertical cross-section through line AA of the optical component shown in FIG. 1.
Figure 3:
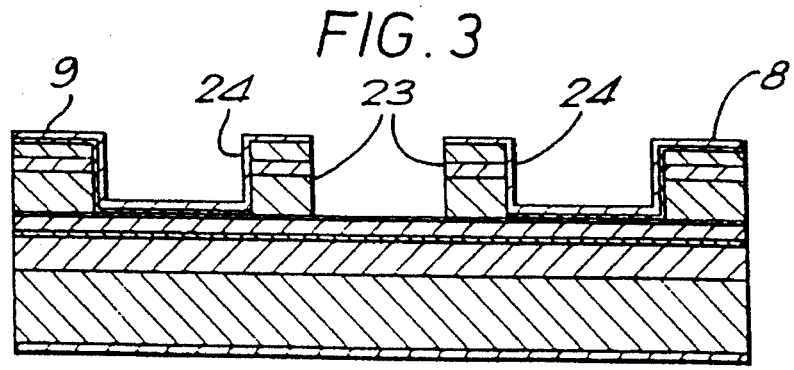
FIG. 3 is a vertical section through line BB of the optical component shown in FIG. 1.

Referring now to the drawings and FIGS. 1–3 in particular, there is shown an optical component formed on a PN heterojunction wafer 1. The lower surface of the wafer is metallised to form an electrical contact 2. The upper surface of the wafer is etched to form a pair of ridge waveguides 3 and 4. At one end of the wafer 5, the ridge waveguides 3 and 4 are close together so that radiation propagating in one guide can easily couple into the other guide. As they pass across the surface of the wafer the ridge guides 3 and 4 diverge from each other so that at the end 6 of the wafer the ridge waveguides 3 and 4 are relatively remote from one another. In the region where the ridge waveguides 3 and 4 are close together, the waveguides are asymxnetric, that is to say the inner wall 23 of the waveguide is shallower than the outer wall 24 because of a land of material 7 between the guides which enhances the optical coupling. The upper surface of wafer 1 has two areas of metallisation 8 and 9. These areas of metallisation link from the contact posts 10 and 11 to the surfaces of ridge waveguides 3 and 4 and are electrically coupled to the wafer through the ridge waveguides. The metallisation is electrically isolated from the rest of the wafer by dielectric layer 19. The contacts 8 and 9 are electrically isolated from each other, so that current can be fed to either ridge waveguide 3 or ridge waveguide 4 separately. The end facets of ridge waveguides 3 and 4, at both ends 5 and 6 of the wafer may be provided with anti-reflection coatings.

Typically the ridge waveguides 3 and 4 have a width between 1.5 and 3 μm, and are separated by a trough between 0.1 and 2 μm deep. The length of the ridge waveguides in the region where they are proximate to each other, in other words the length of land 7 between the ridge waveguides is in the region of 200–400 μm. The separation of the ridge waveguides in the region where they are proximate to each other is between 1 and 4 μm. The ridge waveguides 3 and 4 curve into divergence with a curve length greater than 100 μ, a curve radius greater than 150μm and a total bend angle of 9° or less. The overall length of the component from back face 5 to front face 6 is between 1 and 1.5 mm.

Turning now to FIGS. 2 and 3, the wafer from which the component is fabricated is built up of a plurality of semiconducting epilayers 12–18. The substrate 11 is n-type indium phosphide on which is formed a n-type indium phosphide buffer layer 12 with a doping of $2–5 \times 10^{18}$ cm$^{-3}$. The active layer of the device, 13, comprises intrinsic InGa.AsP having a thickness of between 0.12 and 0.22 μm and is of course undoped. The bandgap of the material in layer 13 corresponds to a wavelength of 1.54±0.02 μm. Layer 14 is p-type indium phosphide having a doping of $4–6 \times 10^{17}$ cm$^{-3}$, and a thickness of between 0.08 and 0.2 μm. Layer 14 may alternatively comprise InCaAsP with a band gap corresponding to a wavelength of 1.1 μm. Layer 12, 13 and 14 form a p-i-n junction, which when appropriately excited can give optical gain. Layer 15 comprises p-type InGaAsP with a doping of $4–6 \times 10^{17}$ cm$^{-3}$ with a bandgap corresponding to either a wavelength of 1.1, 1.3 or 1.5 μm, the layer is 0.03 μm thick and acts as an etch stop layer in the fabrication of the device. Layers 16, 17 and 18 are layers having graded conductivity, with layer 18 having the highest conductivity to provide a good electrical contact with metallisation 8. Layer 16 has the lowest conductivity so as to provide electric isolation between the two ridge waveguides. Layer 16 is p-type indium phosphide having a doping of $4–6 \times 10^{17}$ cm$^{-3}$ and a thickness of 1 μm. Layer 17 is p-type indium phosphide with a doping of $1–5 \times 10^{18}$ cm$^{-3}$ and a thickness of 0.5 μm. Layer 18 is p-type In(0.53)Ga(0.47)As with a doping of $2 \times 10^{19}$ cm$^{-3}$ and a thickness of between 0.1 and 0.2 μm.

Layer 19 is pyrox, another silicon oxide, or a silicon nitride which acts as a dielectric and has a thickness of 0.2 μm. Layer 19 extends up to the outer walls 24 of the ridge waveguides and ensures that current is injected into the device only through the ridge waveguides, by electrically isolating the remaining parts of the wafer from metallisation 8 and 9. The metallisation layers 2, 8 and 9 are titanium gold, i.e. a layer of gold deposited on a thin layer of titanium, or titanium platinum gold.

The separation of the active layer 13 from the base of the trough 20 between the ridge waveguide and the contact 10 is between 0.08 and 0.2 μm. The distance between the surface of land 7 and the active layer 13 is between 0.4 and 1.1 μm.

The precise choice of optimum combinations of parameters within the specified ranges can be made by trial and error and the exercise of a designer's normal skills. In essence the parameter ranges specified should be viewed as tolerance ranges for the value of the parameters set out in tables 1 and 2. It should be recognised that, as with all tolerance ranges. the selection of values from the extremes of several tolerance ranges may yield a non functioning device.

The wafer is fabricated by known metal organic vapour phase epitaxy processes or known molecular beam epitaxy processes. Optical components are formed from the wafer using photolithography with etching metallisation, deposition and cleaving processes. Etch depths are, in part, controlled by incorporating etch stop layers, such as layer 15 in the wafer structure.

In detail the fabrication process for an optical component according to the invention comprises the steps set out below.

1. The process of fabrication commences with a wafer, from which a plurality of components will be made having a substrate corresponding to substrate 11 of FIG. 3 with epilayers which correspond to layers 12–18. The epilayers are formed using metal organic vapour phase epitaxy or molecular beam epitaxy.

2. The surface of the wafer is coated with silicon nitride which is deposited by plasma enhanced chemical vapour deposition to form a masking layer. The plasma is formed from a mixture of silane and ammonia.

3. Photolithography is then used to define an etch pattern corresponding to the region between ridge guide 3 and contact post 10 and ridge guide 4 and contact post 11. At this stage the region between ridge guides 3 and 4 is not to be etched (see step 14 below). The silicon nitride mask is then etched using a reactive ion etch in which carbon tetrafluoride is the active ingredient.

4. After etching the resist is removed.

5. The semi-conductor underlying the silicon nitride mask is then etched in the regions not covered by the silicon nitride mark either by using a dry plasma etch having a composition of 15% methane, 85% hydrogen with plasma power of 200–400 watts, or a wet mineral acid etch using a mixture of hydrochloric acid and orthophosphoric acid.

6. Plasma etching produces a polymer on the surface of the semi-conductor, and, if a plasma etch is used in step 5, the polymer is removed by "oxygen ashing", i.e. exposing the wafer to an oxygen plasma.

7. The silicon nitride mask is then removed using Sylox (RTM). an etch incorporating buffered hydrofluoric acid.

8. The surface of the wafer is coated with pyrox, a silicon oxide, using plasma enhanced chemical vapour deposition.

9. Photolithography is then used to define contact windows with the ridge waveguides 3 and 4 prior to metallisation of the top surface of the wafer.

10. The pyrox is etched using Sylox, and the resist removed.

11. Metal is then deposited through and over the mask formed on the top surface of the wafer by sputtering, the pyrox mask forms dielectric layer 19.

12. The wafer is then annealed at 400° C. for 2 minutes.

13. A layer of gold is deposited on the top surface of the wafer.

14. Photolithography is used to define a pattern for removal of material between ridge guides 3 and 4 by etching.

15. The layer of gold is then etched using argon ion beam milling.

16. The semi-conductor is then etched through the mask formed in the gold by a methane hydrogen plasma—comprising 15% methane, 85% hydrogen, and this is followed by "oxygen ashing", (see step 6 above).

17. The area between ridge waveguides 3 and 4 has now been etched down to the level of the top surface of land 5. Photolithography is used to define the area between ridge waveguides 3 and 4, front surface 6 of the component and the front surface of land 7. The semiconductor material is then etched using a liquid etch of hydrochloric acid and orthophosphoric acid. After this etch the surface topography of the component is fully defined.

18. The substrate is then thinned from about 300 μm to 100 μm by removing material from the exposed surface of the substrate using a bromine in methanol solution.

19. The electrode 2 on the bottom of the substrate is deposited by sputtering.

20. In the final step the wafer is cleaved using conventional techniques into individual components.

A typical device according to the invention has the layer structure set out in Table 1 below and dimensions set out in Table 2 below.

TABLE 1

Composition and thickness of Wafer Epilayers

| Layer | Composition | Doping [cm$^{-3}$] | Bandgap Equivalent Wavelength [μm] | Thickness [μm] |
|---|---|---|---|---|
| 2 | Titanium gold | | | |
| 11 | n-InP | | | |
| 12 | n-InP | $2.3 \times 10^{18}$ | | 1.0 |
| 13 | i-InGaAsP | | $1.54 \pm 0.02$ | 0.15 |
| 14 | p-InP | $5.5 \times 10^{17}$ | | 0.15 |
| 15 | p-InGaAsP | $5.5 \times 10^{17}$ | 1.1, 1.3 or 1.5 | 0.03 |
| 16 | p-InP | $5.5 \times 10^{17}$ | | 1.0 |
| 17 | p-InP | $1 \times 10^{18}$ | | 0.5 |
| 18 | p-In(0.53)Ga(0.47)As | $2 \times 10^{19}$ | | 0.18 |
| 19 | Pyrox (silicon oxide) | | | 0.2 |
| 8, 9 | Titanium gold | | | 0.5 |

In summary, layers 2, 8 and 9 are electric contacts, layer 11 is the substrate, layers 12, 13, 14 form a p-i-n junction, layer 15 is an etch stop, layers 16, 17, 18 form the ridge guides, layer 19 provides electric isolation.

TABLE 2

Exemplary Dimensions of a Device

| Dimension | Value |
|---|---|
| C | 2.6 μm |
| D | 3.4 μm |
| E | 0.15 μm |
| F | 1.1 μm |
| G | 0.8 μm |
| H | 330 μm |
| I | 735 μm |
| J | 205 μm |
| Bend Angle of bend 10 | 9 degrees |
| Bend Radius of bend 10 | 1000 μm |

Figure 5:
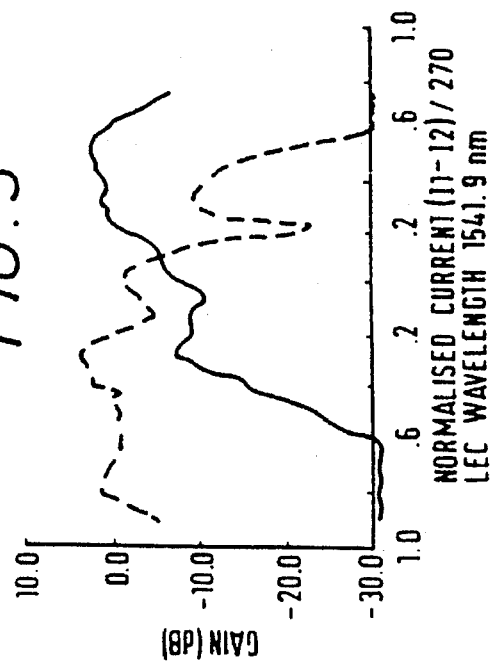
FIGS. 4–7 are graphs showing the wavelength dependency of the optical component illustrated in FIG. 1.
Figure 7:
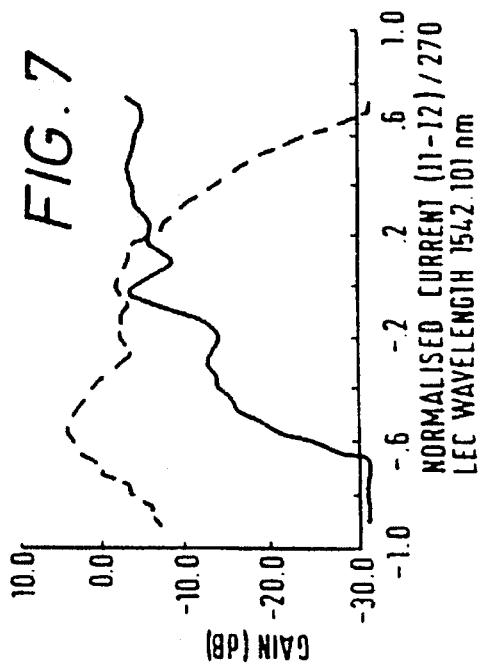
Figure 8:
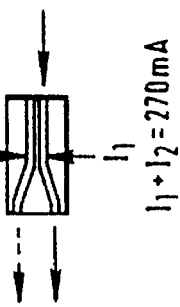
FIG. 8 is a schematic diagram of the device shown in FIG. 1 illustrating the optical connections employed in obtaining the results illustrated in FIGS. 4–7.
Figure 4:
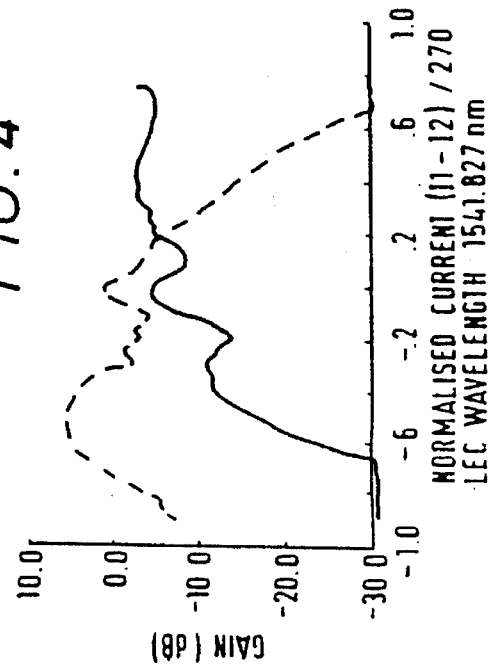
Figure 6:
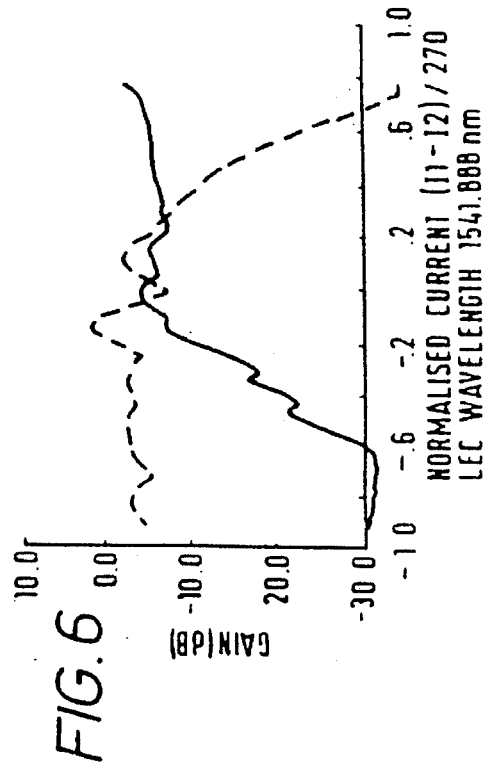

When the optical component shown in FIG. 1 is used as a 1×2 optical switch, light is launched, into one of ridge waveguides 3 and 4 at face 5 of the component. Voltages are applied to contacts 8 and 9 so that current I1 passes through ridge guide 3 via contact 8 and current I2 passes through ridge guide 4 via contact 9. For a device having the structure and dimensions specified in Tables 1 and 2, and configured as shown in FIG. 8, with I1+I2=270 mA, the variation of gain measured in dB with normalised current, i.e. (I1—I2)/270 is shown for different wavelengths in FIGS. 4, 5, 6 and 7. The dotted curves correspond to the output from ridge guide 4 and the continuous lines to the output from ridge guide 3. In FIG. 4 it can be seen that at a wavelength of 1541.827 nm and a normalised current of −0.7 the output from ridge guide 4 shows gain, i.e. greater than 0 dB gain and the output from ridge guide 3 shows a loss of greater than 30 dB. FIGS. 5, 6 and 7 show performance at wavelengths of 1541.9, 1541.998, and 1542.101 nm respectively. It will be seen that as the wavelength changes the output from guide 3 falls to below 0 dB gain.

This illustrates the wavelength sensitivity of this device. Strong wavelength sensitivity is not desirable. The results shown in FIGS. 4–7 were obtained with a device which did not include anti-reflection coatings on the end faces of the component. By including such anti-reflection coatings, the component should be much less sensitive to wavelength because of a reduction in optical feedback caused by reflections. The total current, 270 mA, passed through the device is below the lasing threshold for the device. If the total current exceeds 330 mA (in the absence of anti-reflection coatings) the device will lase. Reducing optical feedback raises the lasing threshold allowing greater injection currents and hence higher gains to be obtained. The device will therefore operate with greater than 0 dB gain over a greater wavelength range. The maximum current at which the device will operate without lasing depends both on the device size and the reflectivity of the end faces. To operate as a viable switch, the optical loss in the light transmitting path should be less than 10 dB. The performance of the device at the wavelengths to which FIGS. 4–7 relate meets this criteria in all cases. As the current is increased towards lasing threshold, the output from the device becomes extremely noisy. The optimum wavelength for the device can be changed by varying the temperature of the device, total injection current, and length of the device. As wavelength moves away from the optimum wavelength the device becomes increasingly lossy.

Figure 11:
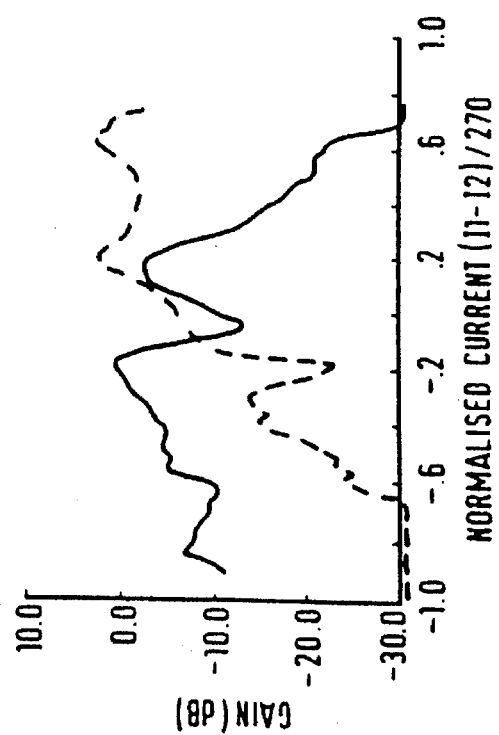
FIG. 9 and FIG. 11 are graphs showing the optical performance of the component illustrated in FIG. 1.
Figure 12:
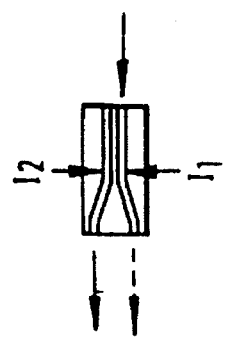
FIGS. 10 and 12 show the optical connections used in obtaining the results illustrated in FIGS. 9 and 11.
Figure 9:
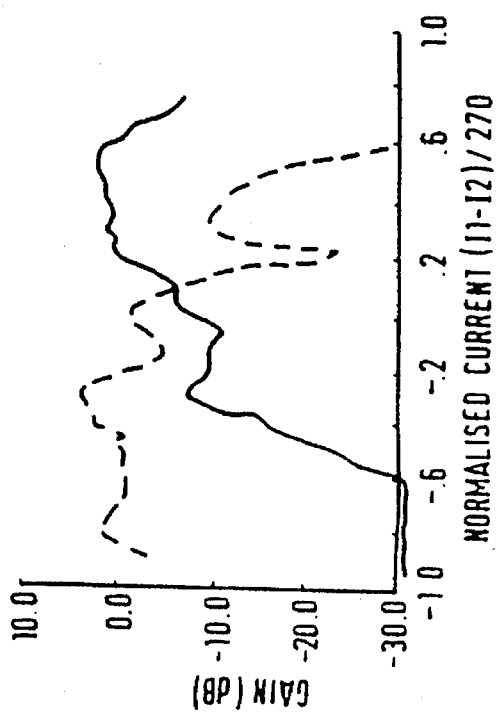
Figure 10:
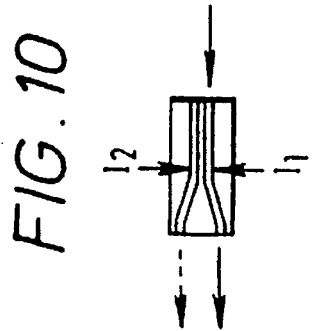

FIGS. 9 and 11 show that optical performance does not depend critically into which of the two ridge waveguides the optical input is launched. FIGS. 10 and 12 show the optical and current configurations used to obtain the output characteristics shown in FIGS. 9 and 11.

As described with reference to FIGS. 4–12 the device is operating as a 1×2 switch.

Figure 13:
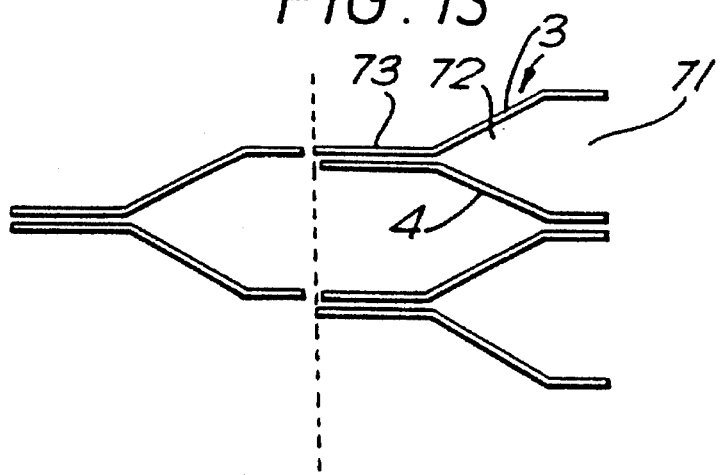
FIG. 13 shows schematically the way in which optical components illustrated in FIG. 1 can be interconnected to produce a switching array.

FIG. 13 illustrates in schematic form the way in which three devices can be interconnected to form a 1×4 switching array. It would of course be possible to connect further devices into a tree and branch structure to create 1×8 and 1×6, etc, switching arrays. It should be noted that the dotted line in FIG. 13 indicates a break in the metallisation so that the electric contacts of adjacent devices are isolated from each other. It should be noted that the four output guides, although shown proximate each other for ease of illustration, are all optically isolated.

By reversing the direction of optical coupling illustrated in FIGS. 8, and 12, it is possible to produce a selective optical combiner which can combine the optical inputs from two ports into a single output port. Such a device can selectively accept an optical input from either one or other of the ridge waveguides, or from both ridge waveguides. The device is also capable of combining optical signals propagating in opposite directions. When operating in this mode light enters guide 3 through face 5, see FIG. 1, and through guide 3 from face 6. The combined output leaves the device from face 6 through guide 4. The input to guide 3 is reflected at face 5 and the reflected light is coupled, with gain into guide 4. It should be noted the device actually couples with optical gain, or at least low loss. Optical combiners of this type can also be assembled into arrays as shown in FIG. 13.

As can be seen from the schematic representation of the ridge waveguides 3 and 4 in FIG. 13, the component may include a region 71 where the ridge waveguides are parallel and optically isolated from each other in addition to regions 72, 73 which have been described previously. This particular configuration for the waveguides enables easier coupling between components.

The component can be electrically pumped as described above or optically pumped using light of an appropriate wavelength. Pump radiation can be isolated from the device output by use of appropriate filters.

The wafer structure previously described is based on an InGaAsP system with a bandgap equivalent to a wavelength of 1.54 µm. Other wafer structures could be employed, for example InCaAsP material with a different bandgap. Basically any III–V heterostructure could be employed for fabrication of a device of this type, however multiple quantum wells, superlattice structures and systems for operation at 0.8 µm based on the AlGaAs/GaAs system are of particular interest.

Figure 14:
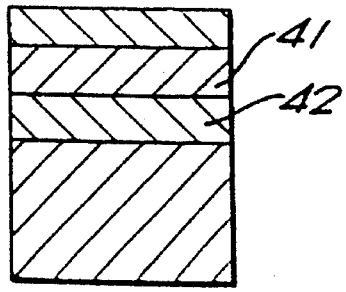
FIGS. 14–17 show variations in the epilayer structure of the device shown in FIG. 1.
Figure 15:
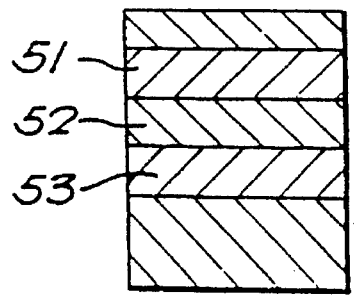

In the device shown in FIG. 1 the active layer 13 could be replaced by the composite structures shown in FIG. 14 or FIG. 15. In FIG. 14 the active layer 13 is replaced by two layers 41 and 42, the rest of the structure remaining identical. Layer 41 comprises intrinsic InGaAsP material having a bandgap corresponding to a wavelength of 1.54±02 µm and a thickness of 0.12–0.22 µm. Layer 42 comprises a p-type InGaAsP having a bandgap corresponding to a wavelength of 1.3 µm, a doping of $3\times10^{17}$ and a thickness of between 0.2 and 0.3 µm.

In FIG. 15 the active layer 13 of FIG. 1 is replaced by a composite structure comprising three layers, 51, 52 and 53. Layer 51 comprises intrinsic InGaAsP having a bandgap equivalent of a wavelength of 1.54±0.02 µand a thickness of 0.12–0.22 µm. Layer 52 is a spacing layer comprising n-type InP with a doping level of $3\times10^{17}$ cm$^{-3}$ and a thickness of 0.05–0.15 µm. Layer 53 comprises p-type InGaAsP having a bandgap equivalent to a wavelength of 1.3 µm and a doping of $3\times10^{17}$ cm$^{-3}$ with a thickness of 0.2–0.3 µm.

The use of the composite structures as described with references to FIGS. 14 and 15 in place of the active layer 13 in FIG. 1 changes the mode field shape as a result of refractive index changes, and pulls the optical field towards the lower surface of the device. Effective switch operation requires that optical amplification be uniquely associated with only one ridge guide. This effect improves optical coupling when a deep trough is used to separate the ridge waveguides 3, 4 in order to reduce current spreading. It also enables the device to provide good coupling with a lower land 7. The greater the depth of the groove between the ridge guides, i.e. the thinner land 7, the easier the device is to fabricate and the better the isolation of waveguides 3 and 4.

Figure 16:
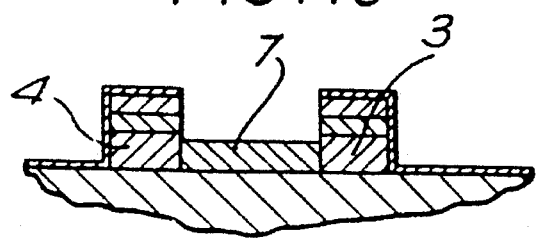

The land 7 shown in FIG. 1 is formed during fabrication by controlled etching of the wafer. In an alternative embodiment the land 7 is formed as shown in FIG. 16, by deposition of silicon having a thickness between 0.1 and 0.2 µm. Using silicon for land 7 enhances the electric isolation of ridge waveguides 3 and 4. By reducing the asymmetry of the guides 3 and 4 as shown in FIG. 16, optical coupling is reduced. To maintain good optical coupling the material used for land 7 must have a high refractive index typical 3.1 to 3.4. Silicon satisfies this requirement, another suitable material is iron doped indium phosphide.

Figure 17:
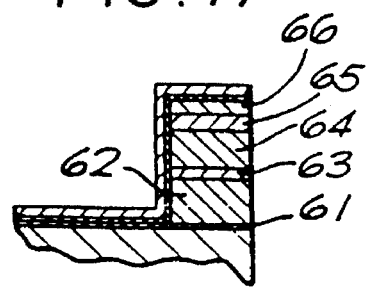

Finally, a modified wafer structure for ridge waveguides and contact posts 8 and 9 is shown in FIG. 17. In this structure layer 16 of FIG. 3 is split into two layers, 62, 64, see FIG. 17, by an etch stop layer 63. The inclusion of layer 63 assists in the fabrication of the device. Layer 62 and 64 are 0.5 µm thick and are made of the same material as layer 16 of FIG. 3. Layer 63 comprises p-type InGaAsP having a bandgap equivalent to a wavelength of 1.3 or 1.1 µm.

We claim:

1. A twin guide optical amplifier comprising:
   a first light guiding path optically connected to second and third light guiding paths a first light amplification zone extending continuously through or beneath at least a portion of both said first and said second light guiding paths, and a second light amplification zone extending continuously through or beneath at least a portion of both said first and said third light guiding paths.

2. A twin guide optical amplifier as in claim 1 including a plurality of semi-conductor epilayers formed on a semi-conductor substrate, in which the first, second and third light guiding paths are ridge waveguides.

3. A twin guide optical amplifier as in claim 2 in which said first light guiding path comprises a pair of ridge waveguides arranged so that in use an evanescent field from each waveguide interacts with the other ridge waveguide.

4. A twin guide optical amplifier as in claim 3 wherein each of said second and third light guiding paths constitute continuations of one of said pair of ridge waveguides respectively, and are arranged to diverge each from the other.

5. A twin guide optical amplifier as in claim 3 which includes:

first and second electrically conducting layers each isolated from the other, said first conducting layer extending continuously over one of said pair of ridge waveguides in both a region where said ridge waveguides are intercoupled by an evanescent field and a region in which said ridge waveguides are not so coupled said second conducting layer extending continuously over the other of said pair of ridge waveguides in both a region where said ridge waveguides are intercoupled by an evanescent field and a region in which said ridge waveguides are not so coupled arranged so that in use an electric current passed through the optical component via said first conducting layer activates said first light amplification zone and an electric current passed through the optical component via said second conducting layer activates said second light amplification zone.

6. A twin guide optical amplifier as in claim 3 including a land between said pair of ridge waveguides in the region where said ridge waveguides are intercoupled by an evanescent field.

7. A twin guide optical amplifier as in claim 2 in which said plurality of semi-conductor epilayers formed on a semi-conductor substrate comprises an InGaAsP system.

8. A twin guide optical amplifier as in claim 7 in which said plurality of epilayers are formed on an n-type indium phosphide substrate and include:

an n-type indium phosphide buffer layer with a doping level of $2-5 \times 10^{18}$ cm$^{-3}$, an active layer of intrinsic InGaAsP having a thickness between 0.12 and 0.22 µm and a bandgap equivalent to a wavelength of $1.54 \pm 0.02$ µm, a layer of p-type indium phosphide formed on said active layer having a doping level of $4-6 \times 10^{17}$ cm$^{-3}$ and a thickness between 0.08 and 0.2 µm.

9. A twin guide optical amplifier as in claim 7 in which said plurality of epilayers have physical characteristics substantially as set out in Table 1.

10. A twin guide optical amplifier as in claim 6 having physical dimensions substantially as set forth in Table 2.

11. A twin guide optical amplifier as in claim 2 in which said plurality of semi-conducting epilayers formed on a semi-conductor substrate comprises a multiple quantum well structure.

12. A twin guide optical amplifier as in claim 2 in which said plurality of semi-conductor epilayers formed on a semiconductor substrate comprises a superlattice structure.

13. A twin guide optical amplifier as in claim 2 in which said plurality of semi-conductor epilayers formed on a semiconductor substrate is based on an AlGaAs/GaAs system.

14. A twin guide optical amplifier as in claim 6 in which the land between the ridge waveguides in the region where they are intercoupled by an evanescent field is formed from the same material as said ridge waveguides.

15. A twin guide optical amplifier as in claim 6 in which the land between said ridge waveguides in the region where they are intercoupled by an evanescent field is silicon.

16. A twin guide optical amplifier as in claim 8 in which said active layer is formed from a pair of layers.

17. A twin guide optical amplifier as in claim 16 in which said pair of layers are separated by a spacing layer.

18. A twin guide optical amplifier as in claim 2 having an anti-reflection coating deposited on at least one end facet of said plurality of semi-conducting epilayers.

19. A twin guide optical amplifier as in claim 1 wherein all said light guiding paths comprise substantially index guiding semiconductor waveguide structures.

20. A twin guide optical amplifier as in claim 19 wherein the waveguide structures comprise ridge waveguides.

21. A twin guide optical amplifier as in claim 1 fabricated from a wafer comprising a plurality of semi-conductor epilayers formed on a semi-conductor substrate by a process comprising selective etching and metallisation.

22. A twin guide optical amplifier as in claim 21 in which said wafer includes at least one epilayer which acts as an etch stop during fabrication.

23. A twin guide optical amplifier as in claim 1 connected as a 1×2 optical switch.

24. A twin guide optical amplifier comprising an array of interconnected optical switches as in claim 23.

25. A twin guide optical amplifier as in claim 1 connected as an optical combiner.

26. An array of optically connected optical amplifiers as in claim 1.

27. A 1×n switch, where $n=2^m$ and m is an integer incorporating an array of optical components as in claim 26.

28. An n×1 optical combiner where $n=2^m$ and m is an integer incorporating an array of optical amplifiers as in claim 26.

29. A twin guide optical amplifier as in claim 19 comprising an InGaAsP material system.

30. A twin guide optical amplifier as in claim 19 comprising an AlGaAs/GaAs material system.

31. A twin guide optical amplifier as in claim 19 comprising a semiconductor heterostructure including a quantum well structure.

32. A twin guide optical amplifier as in claim 19 comprising a semiconductor heterostructure including a strained superlattice structure.

* * * * *